United States Patent
Chu et al.

(10) Patent No.: US 10,481,180 B2
(45) Date of Patent: Nov. 19, 2019

(54) METHOD FOR SENSING POWER CONSUMPTION AND SENSING DEVICE

(71) Applicant: INDUSTRIAL TECHNOLOGY RESEARCH INSTITUTE, Hsinchu (TW)

(72) Inventors: Bo-Yin Chu, Hsinchu (TW); Hsu-Cheng Chiang, Hsinchu (TW); Ming-Shan Jeng, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 92 days.

(21) Appl. No.: 15/867,802

(22) Filed: Jan. 11, 2018

(65) Prior Publication Data
US 2019/0154734 A1   May 23, 2019

(30) Foreign Application Priority Data
Nov. 17, 2017   (TW) .............................. 106139918 A (51) Int. Cl.
*G01R 15/18*   (2006.01)
*G01R 19/175*  (2006.01)
*G01R 19/02*   (2006.01)
*G01R 21/133*  (2006.01)

(52) U.S. Cl.
CPC .......... *G01R 15/181* (2013.01); *G01R 19/02* (2013.01); *G01R 19/175* (2013.01); *G01R 21/133* (2013.01)

(58) Field of Classification Search
None
See application file for complete search history.

(56) References Cited

U.S. PATENT DOCUMENTS

| | | | | |
|---|---|---|---|---|
| 4,140,933 A | * | 2/1979 | Wambsgannss | H02K 19/36 310/168 |
| 6,064,192 A | * | 5/2000 | Redmyer | G01R 15/186 324/117 H |
| 6,330,516 B1 | | 12/2001 | Kammeter | |
| 6,617,858 B1 | * | 9/2003 | Baumgaertl | G01R 19/2509 324/424 |
| 7,068,045 B2 | | 6/2006 | Zuercher et al. | |

(Continued)

FOREIGN PATENT DOCUMENTS

| | | |
|---|---|---|
| CN | 202351323 | 7/2012 |
| CN | 103063900 | 4/2013 |

(Continued)

OTHER PUBLICATIONS

Taiwanese Office Action for Taiwanese Patent Application No. 106139918 dated Mar. 19, 2018.
Donnal, et al. "Noncontact Power Meter", IEEE Sensors Journal, vol. 15, No. 2, Feb. 2015, pp. 1161-1169.

(Continued)

*Primary Examiner* — Clayton E. LaBalle
*Assistant Examiner* — Jas A Sanghera
(74) *Attorney, Agent, or Firm* — Amin, Turocy & Watson LLP (57) ABSTRACT

A sensing device includes a housing positioned on an outer surface of a wire and a circuit board received in the housing. The circuit board has a sensing area for sensing the wire, such that the measurements obtained by the circuit board are relative values. Therefore, the circuit design of the circuit board can be simplified, and the size of the sensing device can be reduced.

18 Claims, 6 Drawing Sheets

(56) References Cited

U.S. PATENT DOCUMENTS

| | | |
|---|---|---|
| 7,098,644 B1 | 8/2006 | Denison |
| 7,265,533 B2 | 9/2007 | Lightbody et al. |
| 7,622,912 B1 | 11/2009 | Adams et al. |
| 8,972,211 B2 | 3/2015 | Yogeeswaran et al. |
| 9,414,494 B2 | 8/2016 | Klein |
| 9,689,899 B2 | 6/2017 | Cook et al. |
| 2002/0171433 A1* | 11/2002 | Watanabe ............... G01R 15/16 324/539 |
| 2005/0156587 A1 | 7/2005 | Yakymyshyn et al. |
| 2006/0265155 A1* | 11/2006 | Goldfine ............ G01R 27/2623 702/57 |
| 2009/0119036 A1* | 5/2009 | Jayanth ................. F04B 49/065 702/60 |
| 2009/0140726 A1* | 6/2009 | Janke ..................... G01R 33/07 324/207.13 |
| 2012/0074929 A1 | 3/2012 | Wobschall |
| 2014/0145858 A1* | 5/2014 | Miller ................... G08C 17/02 340/870.07 |
| 2015/0054610 A1* | 2/2015 | Cook ...................... H01F 27/06 336/132 |

FOREIGN PATENT DOCUMENTS

| | | |
|---|---|---|
| CN | 106646132 | 5/2017 |
| CN | 104198872 | 10/2017 |
| TW | 536627 | 6/2003 |
| TW | I439700 | 6/2014 |
| TW | 201608246 | 3/2016 |
| TW | I546542 | 8/2016 |
| TW | M549878 | 10/2017 |

OTHER PUBLICATIONS

Aggarwal, "Non-Contact Wireless Power Monitoring", Electrical Engineering and Computer Sciences University of California at Berkeley, Technical Report No. UCB/EECS-2012-131, May 30, 2012.

* cited by examiner

FIG. 8 ical Field

The present disclosure relates to methods and devices for sensing power consumption, and, more particularly, to a contactless load measuring method and device for sensing power consumption.

2. Description of Related Art

Traditional electricity management typically uses an electricity meter installed at the site of the main power supply to measure the amount of power consumption of a single site (e.g., the electricity consumption of a residential site, a factory, a commercial building and the like) in order to carry out electricity management for the purpose of energy saving.

However, in a single site, a plurality of wires are often laid out to provide different usage requirements (such as for different floors or different interior spaces), so each wire needs to be equipped with an electricity meter. As a result, the electricity management office of that site will have to accommodate a plurality of electricity meters. Furthermore, due to the large number of installations, the cost of installation is high, and the installation is complicated.

Therefore, a Current Transformer (CT) technique has been developed, in which various wires are collected on a distribution panel, and then a current transformer is installed at the junction of each electric wire of the distribution panel, so that one electric wire corresponds to a single current transformer. The current transformers are then pooled together in an electricity meter mainframe (or a centralized analog to digital converter) via extension cords. As such, the waveform signals of the currents measured by the CTs are transmitted back to the electricity meter mainframe (or the centralized analog to digital converter) via the numerous extension cords in an analog manner for subsequent data analysis and application. Therefore, only one electricity meter mainframe is needed to obtain information on power consumption.

However, an extension cord needs to be pulled from each of the current transformers. As such, a large amount of extension cords sprawl from the distribution panel in a star shape, making installation or maintenance cumbersome. These cords also occupy space in the distribution panel, leaving the panel disorganized. Some are designed by connecting a plurality of CTs in parallel on a bus line. This allows a more organized distribution of wires, but is more expensive labor cost in some cases is even higher than the cost of the electricity meter mainframe itself. This type of design will not be widely adopted if the installation hour cannot be lowered.

Therefore, there is a need for a solution that addresses the aforementioned issues in the prior art.

SUMMARY

The present disclosure provides a method for sensing power consumption, which may include: sensing, by a sensing device, a change in a waveform of a current or a voltage on a wire; performing integration operation and digital processing on the waveform of the current or the voltage; and calculating a root mean square of a value of the current or the voltage, wherein the value of the current or the voltage is a relative value.

In an embodiment, the sensing device senses a change in the waveform of the current or the voltage based on an electromagnetic induction principle.

In an embodiment, the method may further include, after performing the integration operation and the digital processing on the waveform of the current or the voltage and prior to calculating the root mean square of the current or the voltage value, performing a filtering process.

In an embodiment, the method may further include calculating a power factor after calculating the root mean square of the current or the voltage value. In another embodiment, calculating the power factor may include detecting zero crossings of the current and the voltage to measure a time difference between the zero crossings, and correcting non-linear load errors using distortions in the current waveform to obtain the power factor.

The present disclosure further discloses a sensing device, which may include: a housing for being positioned on an outer surface of a wire; and a circuit board received in the housing and including a sensing area for sensing a change in a waveform of a current or a voltage of the wire.

In an embodiment, the housing includes a positioning portion corresponding to the wire. In another embodiment, the positioning portion may be a groove for receiving the wire.

In an embodiment, the sensing device may further include a fastening part for fastening the housing to the wire. In another embodiment, the fastening part may be a cable tie, and the housing is formed with at least one through hole, such that the cable tie passes through the through hole and winds around the wire and the housing and the wire abut against each other.

In an embodiment, the circuit board is defined with an analog measuring board area and a digital board area, with a measuring unit and a signal processing circuit provided in the analog measuring board area and a digital operation circuit and a communication unit provided in the digital board area. In another embodiment, a microprocessor may be provided in the digital board area, and a portion of the digital operation circuit and/or a portion of the communication unit is arranged in the microprocessor.

In an embodiment, the measuring unit may include a layout within the sensing area of the circuit board. In another embodiment, the measuring unit may be two symmetric coils that are wound in opposite directions. In yet another embodiment, the measuring unit may include a sensing layer formed on one side of the circuit board and facing the wire. In further embodiment, the measuring unit may further include a ground layer formed on the other side of the circuit board.

In an embodiment, the communication unit may transmit signals to a data storage device via a single transmission line. In another embodiment, the transmission line may connect a plurality of the sensing devices in series.

DETAILED DESCRIPTION

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "below", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 1:
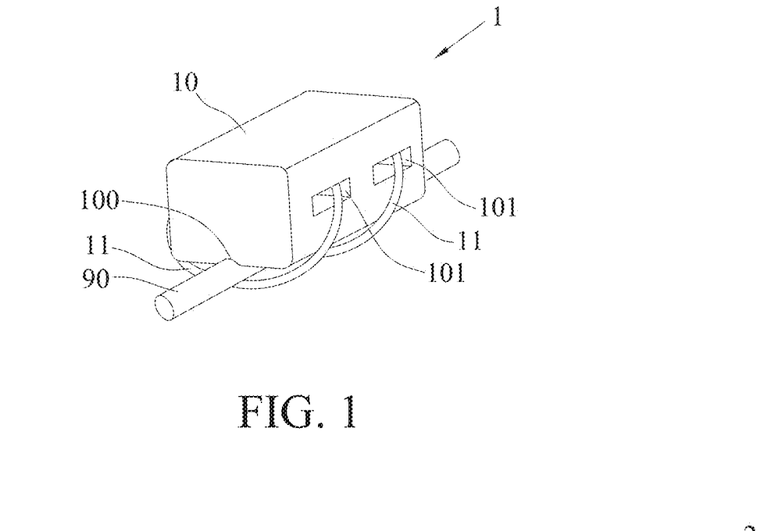
FIG. 1 is an isometric view of a sensing device in use in accordance with the present disclosure.

FIG. 1 is an isometric view of a sensing device 1 in accordance with the present disclosure. The sensing device 1 is a contactless load monitoring sensing device, and includes a housing 10 attached onto a single wire 90, at least one fastening part 11 for fastening the housing 10 on the wire 90, and a circuit board 2 (see FIG. 2) housed in the housing 10.

A positioning portion 100 is provided on a side (e.g., the lower side) of the housing 10 to correspond to the wire 90. For example, the positioning portion 100 is a curved groove extending lengthwise (front to back) on the housing 10, such that the curved upper periphery of the wire 90 fits right into the groove to facilitate the positioning of the wire 90 in the sensing area, such that it is not offset from where it should be. However, there are numerous ways for implementing the positioning portion 100, and the present disclosure is not limited to the above.

The fastening part 11 may be, for example, a cable tie, a Velcro tape, an adhesive or other types of structures. More specifically, as shown in FIG. 1, cable ties are used as an example, in which at least one (e.g., two) through hole 101 penetrating left and right sides is formed in the housing 10, and cables ties are looped through the through holes 101 around the lower curved periphery of the wire 90 to form loop structures. The cable ties are then tightened to reduce the loop areas of the loops, such that the positioning portion 100 of the housing 10 tightly abuts against the wire 90, fastening and preventing the two from detachment. However, there are numerous ways for implementing the fastening part 11, and the present disclosure is not limited to the above.

Figure 2:
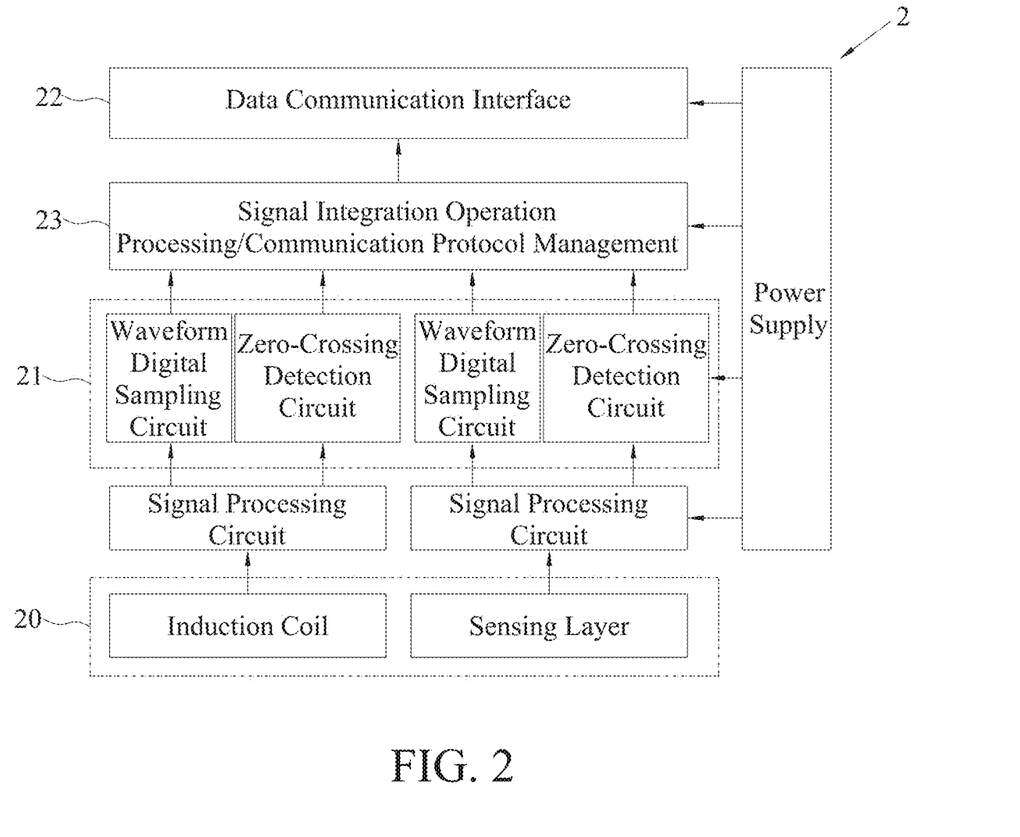
FIG. 2 is a block diagram depicting a circuit configuration of a circuit board of the sensing device according to the present disclosure.

The circuit configuration of the circuit board 2 is shown in FIG. 2. In an embodiment, the circuit board 2 is defined with an analog measuring board area and a digital board area. The digital board area is provided with a microprocessor 23. The circuit board 2 further includes a measuring unit 20 provided in the analog measuring board area, a signal processing circuit (or an analog signal processing circuit) provided in the analog measuring board area, a digital operation circuit 21 (a portion of which is arranged in the microprocessor 23) provided in the digital board area, a communication unit 22 (a portion of which is arranged in the microprocessor 23) provided in the digital board area, and a power supply for providing the circuit board 2 with power it needs. In an embodiment, these board areas can be manufactured as a single circuit board, or the circuit board 2 can be made of two circuit boards that are, for example, stacked one on top of another.

Figure 3A:
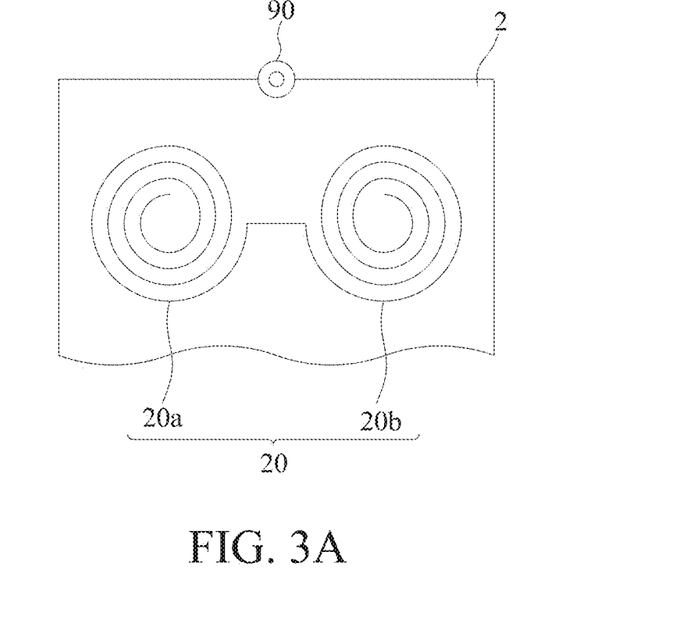
FIG. 3A is a planar schematic diagram depicting a circuit layout of a measuring unit of the circuit board of FIG. 2 in accordance with a first embodiment of the present disclosure.

In an embodiment, the measuring unit 20 is laid out in such a way that coils or sensing electrodes are directly provided on a printed circuit board, so that the cost of the measuring unit 20 is minimal. If higher precision is required, current probes such as current transformers or Rogowski coils can be additionally added. As shown in FIG. 3A, the measuring unit 20 senses the change in the waveforms of a current on the single wire 90 based on the electromagnetic induction principle. For example, the measuring unit 20 includes two symmetrical coils 20a and 20b on two sides of the wire 90, and the two coils 20a and 20b are wound in opposite directions. In an embodiment, one coil 20a is wound in a clockwise direction, while the other coil 20b is wound in an anti-clockwise direction, and vice versa.

Figure 3B:
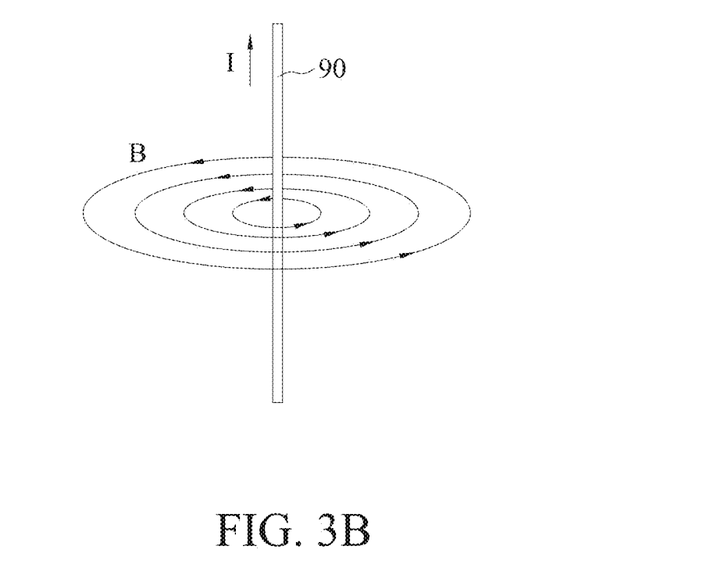
FIG. 3B is a schematic diagram depicting the induction method of FIG. 3A.

As shown in FIG. 3B, when a current I passes through (in the direction of the arrow) the wire 90, according to Ampere's Law, the current I of the wire 90 will create a circular magnetic field B (arrows in FIG. 3B indicating the direction of the magnetic field), and magnetic field strength is proportional to the magnitude of the current I on the wire 90. According to Faraday's Law of induction, voltages will be induced in the two coils 20a and 20b wound in reverse based on the currents in the same direction, and the induced voltages are also proportional to the magnitude of the current I on the wire 90.

Furthermore, as the current I of the wire 90 does not pass through the middle of the two coils 20a and 20b, the magnetic field B is centered around a place not symmetrical to the two coils 20a and 20b, such that when the magnetic field B acts on the two coils 20a and 20b wound in reverse, the voltages induced by the two coils 20a and 20b will cancel each other, preventing the interference of external magnetic field, thus achieving anti-interference.

Figure 5:
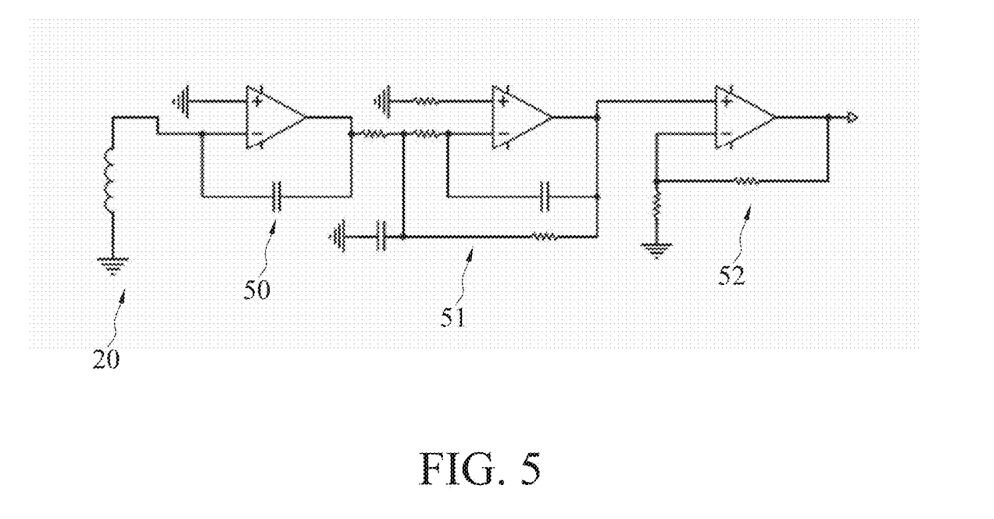
FIG. 5 is a circuit diagram of a signal processing circuit of the circuit board of the sensing device in accordance with the present disclosure.

Moreover, as the signal on the wire 90 is an AC signal, the current I and the signals sensed by the measuring unit 20 are time-varying voltage signals, and an actual waveform and a measured voltage signal have a differential relationship. Therefore, in signal processing, as shown in FIG. 5, the signal processing circuit (or an analog signal processing circuit) of the circuit board 2 performs integration operation using an integration circuit 50 to integrate the signal over time to reconstruct the waveform. Then, according to signal characteristics, a filtering process is performed using a bandpass filter 51 and an amplifying filter process is performed using an amplifier 52 to get a signal in a form that can be digitally sampled before being output.

Figure 4:
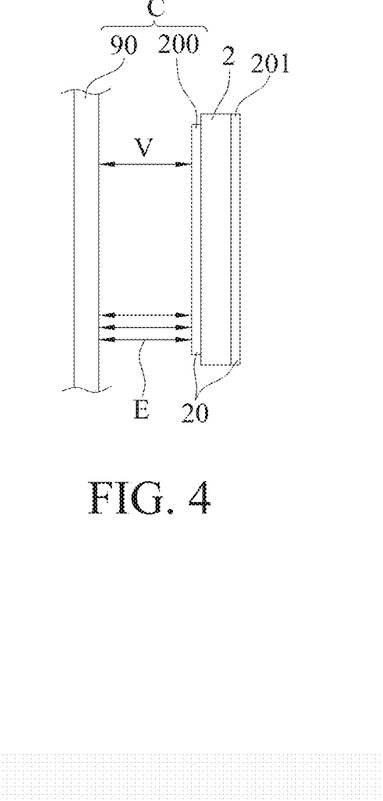
FIG. 4 is a side view of a circuit layout of a measuring unit of the circuit board of FIG. 2 in accordance with a second embodiment of the present disclosure.

In another embodiment, the measuring unit 20 may also be implemented using a parallel surface sensing capacitor to create an electric field due to a voltage difference between the two electrodes. The electric field induces a flow of electric charges, creating changes in the waveform of a current. As shown in FIG. 4, the measuring unit 20 includes a sensing layer 200 (e.g., copper foil as an electrode) formed on a side of the circuit board 2 facing the wire 90 (as another electrode) in parallel, so that the wire 90 and the sensing layer 200 form a capacitive structure C, and the voltage difference V between the wire 90 and the sensing layer 200 creates an electric field E. According to Gauss's Law, a flow of electric charges will be induced in the two metal electrodes in the electric field E, resulting in the creation of a current, and this current will be proportional to the voltage on the wire 90.

Moreover, the measuring unit 20 further includes a ground layer 201 (e.g., a copper foil) formed on the other side of the circuit board 2, which does not have a voltage difference with the sensing layer 200, so no current is induced. Thus, the ground layer 21 is capable of shielding the circuit board 2 from external electromagnetic interference.

Furthermore, the signal sensed by the measuring unit 20 is a time-varying current signal, and, after being converted to a voltage signal, has a differential relationship with the actual waveform. Thus, in signal processing, as shown in FIG. 5, the signal processing circuit (or an analog signal processing circuit) of the circuit board 2 performs integration operation using an integration circuit 50 to integrate the signal over time to reconstruct the waveform. Then, according to signal characteristics, a filtering process is performed using a bandpass filter 51 and an amplifying filter process is performed using an amplifier 52 to get a signal in a form that can be digitally sampled before outputting the signal.

There are numerous types of possible structures of the measuring unit 20, and the present disclosure is not limited to the above as long as it can be implemented directly on the printed circuit board at a low cost.

Figure 8:
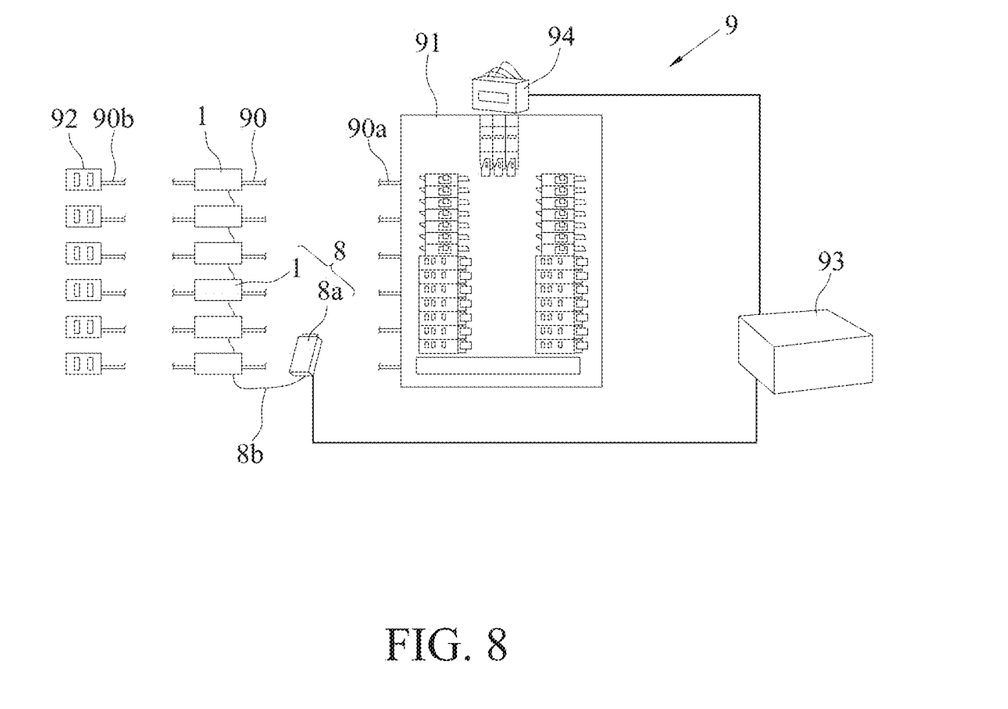
FIG. 8 is a schematic diagram depicting the sensing device according to the present disclosure applied to an electricity measuring system.

As shown in FIG. 2, after the measuring unit 20 senses the signal (in one of the two ways above) and the signal is outputted by the signal processing circuit, digital processing and calculations are performed. The waveform of the current/voltage is sampled at multiple time points by the digital operation circuit 21 (e.g., a waveform digital sampling circuit), and signal integration operation (e.g., a root mean square operation) is performed by the microprocessor 23 on the circuit board 2, and then protocol management is carried out by the a portion of the communication unit 22 that is arranged in the microprocessor 23, and then the signal is transmitted to a data storage device 8a as shown in FIG. 8 through a data communication interface of the communication unit 22.

In an embodiment, the digital operation circuit 21 performs digital sampling on the waveform with a frequency of 4,000 points per second, and then root mean square operation is performed in the microprocessor 23. Therefore, non-linear load can also be accurately measured.

Moreover, a detection circuit is also provided in the digital operation circuit 21, for example, a zero-crossing detection circuit for detecting the zero crossings of the current and the voltage, and outputs a signal to the microprocessor 23. The microprocessor 23 measures the time difference between the zero crossings to evaluate the phase difference, based further on the distortion of the waveform of the current, non-linear load error is corrected, and the power factor can be calculated.

Moreover, the communication protocol management of the communication unit 22 arranged in the microprocessor 23 is used for coordinating operating sequences of various parts in the sensing device 1a and data operations, and transmitting the measured data via the data communication interface of the communication unit 22. For example, a physical layer of the communication protocol management have a parallel design, for example, RS485 differential signals, to reduce interference, such that the communication path can be operated using a single cable, reducing the complexity of the wires. In an embodiment, a single cable can connect up to 254 devices in series. As shown in FIG. 8, a transmission line 8b connects six sensing devices 1 to the data storage device 8a.

In addition, the application layer (a protocol layer) of the communication protocol management of the communication unit 22 is designed in a request-response framework, such as ModBus, which is not only suitable for many transmission methods and also easy to use.

Figure 6:
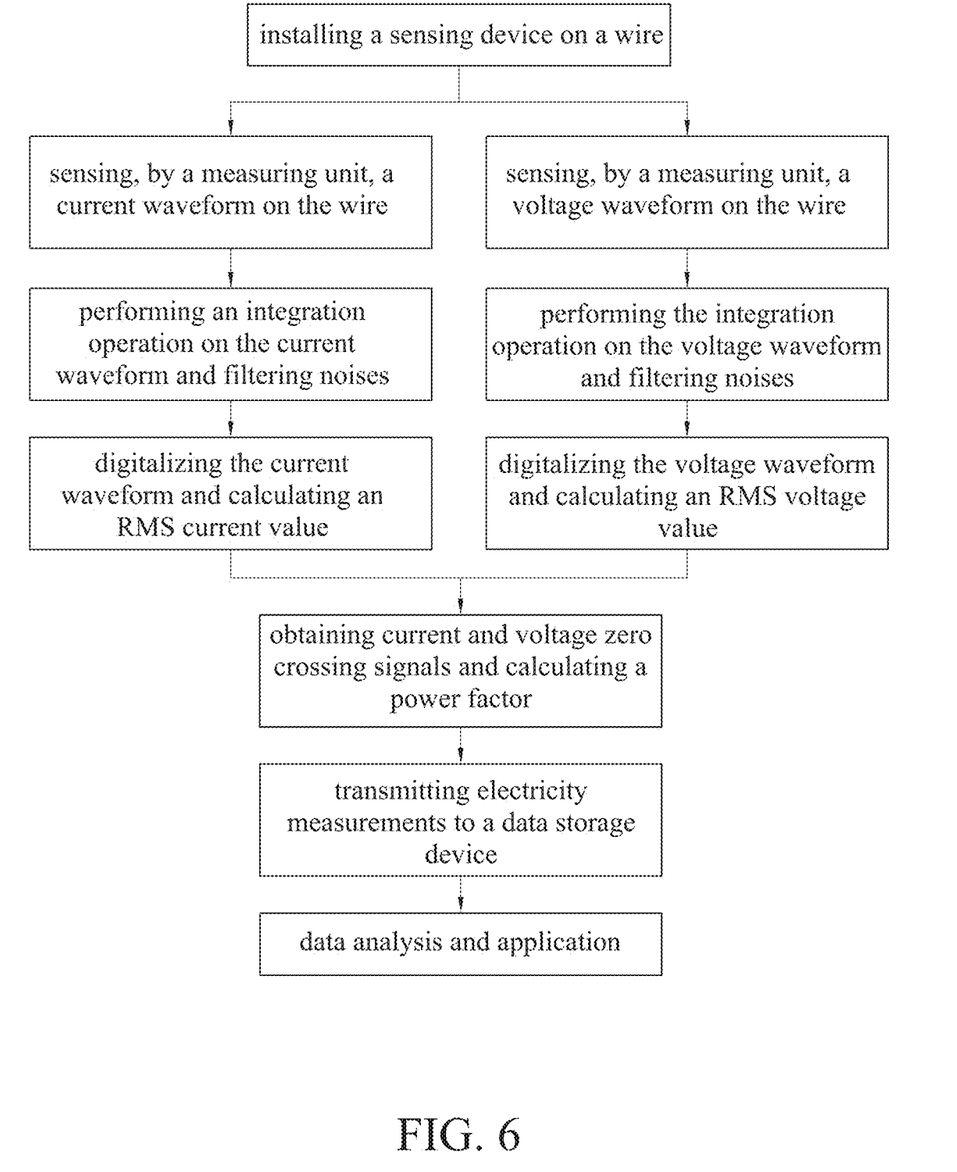
FIG. 6 is a flowchart illustrating a method for sensing power consumption in accordance with the present disclosure.

Therefore, the present disclosure provides a method for sensing power consumption, as shown in FIG. 6, including: affixing the contactless sensing device 1 on the wire 90, such that the measuring unit 20 of the circuit board 2 of the sensing device 1 senses changes in a waveform of a current (or waveform of a voltage) on the wire 90 according to the electromagnetic induction principle; the signal processing circuit of the circuit board 2 performing integration operation and appropriate noise filtering; the digital operation circuit 21 of the circuit board 2 converting the waveform signal of the analog current (or the waveform of the voltage) sensed into a digital signal and calculating the root mean square of the value of the current (or voltage); and transmitting the obtained current (or voltage) signal to the data storage device 8a and/or a computer via a network for subsequent processing of the electricity measurement data. It should be noted that the signal can first be digitalized by the digital operation circuit 21 of the circuit board 2 before the integration operation and the root mean square operation of the value of the current (or voltage) are performed by the signal processing circuit of the circuit board 2.

In an embodiment, the method for sensing power consumption may calculate a power factor if needed. More specifically, the contactless sensing device 1 may be designed with an internal sensor or an external circuit to obtain a voltage signal, especially the zero-crossing signal of the voltage waveform. This type of voltage waveform signal can also be digitalized by the sensing device. For example, the power factor can be calculated by combining the current and voltage waveform signals, or a relative power consumption value can be obtained from a product of the voltage and the current signals.

Thus, the values measured by the sensing device 1 are represented with relative values in a limited range (e.g., number 0 to 1,024).

Figure 7:
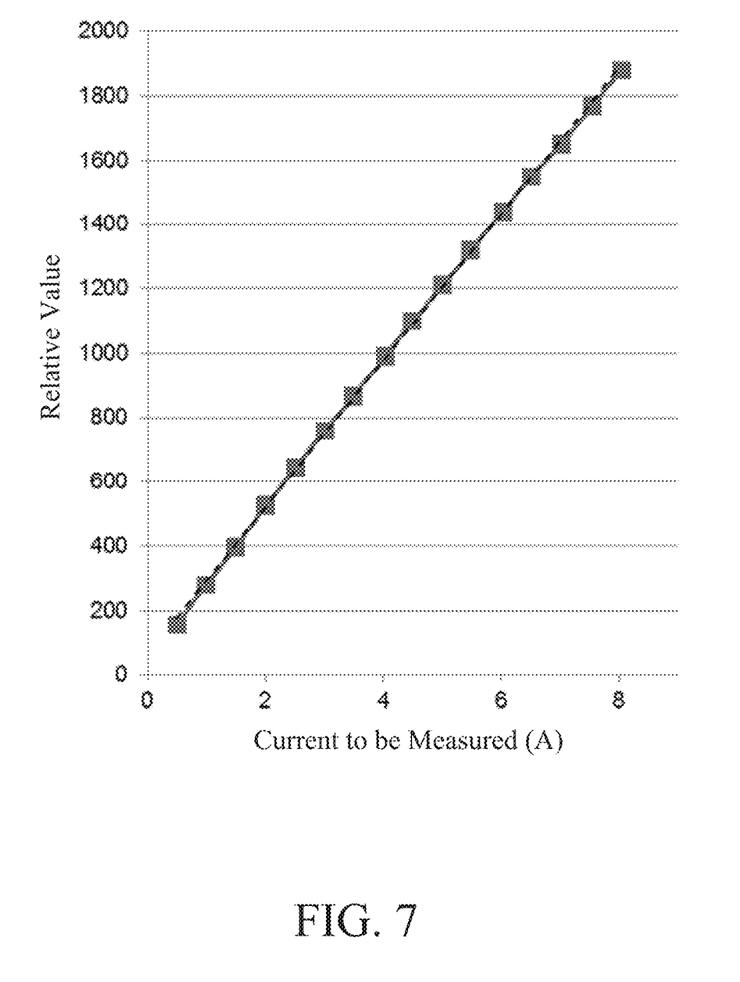
FIG. 7 is a graph depicting relative values measured by the method for sensing power consumption in accordance with the present disclosure.

Moreover, as the method for sensing power consumption according to the present disclosure requires no measurement of absolute precision, the circuit design can be greatly simplified, and the size of the sensing device 1 is greatly reduced. In addition, the need for high-performance and expensive elements used in prior-art smart electricity meter is limited, and they are replaced with cheap elements. As a result, labor cost is reduced as calibration before use is not required, reducing the overall manufacturing cost of the sensing device 1. Even though relative values are measured, the method according to the present disclosure still has high linearity (as shown in FIG. 7). Therefore, if absolute precision is needed, online calibration can be performed to calculate the precise values of the measurements e.g., the current I, the voltage difference V etc.

Furthermore, the sensing device 1 may further combine information of the main electricity meter of a place (a building, a site, etc.) (as shown in FIG. 8), and convert the relative values into absolute values through relevant algorithms, such that it provides measurement just like a physical electricity meter. Therefore, the sensing device 1 is easily to be installed on the wire 90, which makes it suitable for applications that require measurement of power consumption, such as measurement of current loop of a distribution panel, measurement of lighting power consumption, monitoring of abnormal production equipment, energy-saving assessment and the like.

Moreover, FIG. 8 is a schematic diagram depicting the sensing device 1 according to the present disclosure applied to an electricity measuring system 9. The electricity measuring system 9 includes a wire aggregating device 91, a sensing set 8 and a data processing device 93.

The wire aggregating device 91 is a switchboard electrically connected with a plurality of wires 90, such that one port 90a of each of these wires 90 is connected to the wire aggregating device 91, while the other 90b is connected to a plug 92. The electricity information on the wire aggregating device 91 is detected by the main electricity meter 94, wherein the plugs 92 provide power to electrical goods (not shown), such as appliances, 3C products, industrial tools, or other electrical products.

The sensing set 8 includes at least one sensing device 1 and the data storage device 8a for receiving signals from the sensing device 1. When there are a plurality of sensing devices 1, a single transmission line (or a cable) 8b is used to connect the plurality of sensing devices 1 in series before connecting them to the data storage device 8a. The sensing device 1 senses the wire 90 in a non-intrusive manner. The data storage device 8a may be, for example, a personal computer, an industrial computer, a server, a programmable logic controller (PLC), a network interface adapter or a device that supports a universal protocol.

The data processing device 93 is used for receiving the signal data transmitted by the sensing device 1 in the data storage device 8a and the electricity information of the main electricity meter 94 and performing operation analysis on these two data.

In summary, the method for sensing power consumption and the sensing device according to the present disclosure obtains measurements in relative values, such that the circuit design can be greatly simplified, and the size of the sensing device greatly reduced. In addition, the need for high-performance and expensive elements used in prior-art smart electricity meter is eliminated, and they are replaced with cheap elements. As a result, labor cost is reduced as calibration before use is not required, reducing the overall commercializing cost of the sensing device.

Furthermore, the measurements obtained by the present disclosure still has high linearity, such that online calibration can still be performed to obtain accurate units of amperes and voltages.

Moreover, the method for sensing power consumption and the sensing device according to the present disclosure can be further combined with information from on-site main electricity meter to convert the relative values into absolute values through relevant algorithms, thereby obtaining the same effect as if measured using a physical electrical meter.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A method for sensing power consumption, comprising:
    sensing, by a sensing device, a change in a waveform of a current or a voltage on a wire;
    performing integration operation and digital processing on the waveform of the current or the voltage;
    calculating a root mean square of a value of the current or the voltage, wherein the value of the current or the voltage is a relative value, wherein the relative value is a simple number and free from being a measured value of a physical electricity meter; and
    calculating a power factor after calculating the root mean square of the value of the current or the voltage, wherein calculating the power factor includes detecting zero crossings of the current and the voltage to measure a time difference between the zero crossings, and correcting a non-linear load error based on distortion in the waveform of the current to obtain the power factor.

2. The method of claim 1, wherein the sensing device senses the change in the waveform of the current or the voltage based on an electromagnetic induction principle.

3. The method of claim 1, further comprising, after performing the integration operation and the digital processing on the waveform of the current or the voltage and prior to calculating the root mean square of the value of the current or the voltage, performing a filtering process.

4. A sensing device, comprising:
    a housing configured for being positioned on an outer surface of a wire; and
    a circuit board received in the housing and including a sensing area configured for sensing a change in a waveform of a current or a voltage of the wire to allow the sensing device to perform the method for sensing power consumption of claim 1.

5. The sensing device of claim 4, wherein the housing includes a positioning portion corresponding to the wire.

6. The sensing device of claim 5, wherein the positioning portion is a groove configured for receiving the wire.

7. The sensing device of claim 4, further comprising a fastening part configured for fastening the housing to the wire.

8. The sensing device of claim 7, wherein the fastening part is a cable tie, and the housing is formed with at least one through hole for the cable tie to pass therethrough.

9. The sensing device of claim 8, wherein the cable tie is configured to wind around the wire.

10. The sensing device of claim 8, wherein the housing and the wire abut against each other.

11. The sensing device of claim 4, wherein the circuit board is defined with an analog measuring board area and a digital board area, with a measuring unit and a signal processing circuit provided in the analog measuring board area and a digital operation circuit and a communication unit provided in the digital board area.

12. The sensing device of claim 11, further comprising a microprocessor provided in the digital board area, with at least one of a portion of the digital operation circuit and a portion of the communication unit arranged in the microprocessor.

13. The sensing device of claim 11, wherein the measuring unit includes a layout provided within the sensing area of the circuit board.

14. The sensing device of claim 13, wherein the measuring unit includes two symmetric coils wound in opposite directions.

15. The sensing device of claim 13, wherein the measuring unit includes a sensing layer formed on one side of the circuit board and facing the wire.

16. The sensing device of claim 15, wherein the measuring unit further includes a ground layer formed on the other side of the circuit board.

17. The sensing device of claim 11, wherein the communication unit is configured to transmit signals to a data storage apparatus via a single transmission line.

18. The sensing device of claim 17, wherein the single transmission line is configured to connect another sensing device in series.

* * * * *